(12) United States Patent
Corum et al.

(10) Patent No.: US 9,841,480 B2
(45) Date of Patent: Dec. 12, 2017

(54) LOCALIZATION OF MAGNETIC PARTICLES BY MEANS OF SWIFT-MRI

(75) Inventors: Curtis A. Corum, Shoreview, MN (US); Djaudat S. Idiyatullin, New Brighton, MN (US); Steen Moeller, Golden Valley, MN (US); Michael G. Garwood, Medina, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 681 days.

(21) Appl. No.: 13/262,397

(22) PCT Filed: Apr. 1, 2010

(86) PCT No.: PCT/US2010/000979
§ 371 (c)(1),
(2), (4) Date: Dec. 29, 2011

(87) PCT Pub. No.: WO2010/114609
PCT Pub. Date: Oct. 7, 2010

(65) Prior Publication Data
US 2012/0092010 A1   Apr. 19, 2012

Related U.S. Application Data

(60) Provisional application No. 61/166,108, filed on Apr. 2, 2009.

(51) Int. Cl.
*G01R 33/48* (2006.01)
*G01R 33/32* (2006.01)
*G01R 33/56* (2006.01)

(52) U.S. Cl.
CPC ..... *G01R 33/5601* (2013.01); *G01R 33/4816* (2013.01)

(58) Field of Classification Search
CPC ............ G01R 33/5601; G01R 33/4816; G01R 33/446; G01R 33/4616; G01R 33/281
USPC ........................... 324/300–322; 600/407–422
See application file for complete search history.

(56) References Cited

U.S. PATENT DOCUMENTS

| | | | |
|---|---|---|---|
| 3,902,109 | A | 8/1975 | Speth et al. |
| 4,826,673 | A | 5/1989 | Dean et al. |
| 5,050,609 | A | 9/1991 | Balaban et al. |
| 5,357,959 | A | 10/1994 | Fishman |

(Continued)

FOREIGN PATENT DOCUMENTS

| | | |
|---|---|---|
| JP | 2004-242796 A | 9/2004 |
| WO | WO-2006035443 A2 | 4/2006 |

(Continued)

OTHER PUBLICATIONS

"U.S. Appl. No. 12/425,113, Response filed Sep. 27, 2012 to Final Office Action mailed Mar. 30, 2012", 9 pgs.

(Continued)

*Primary Examiner* — Melissa Koval
*Assistant Examiner* — Rishi Patel
(74) *Attorney, Agent, or Firm* — Schwegman Lundberg & Woessner, P.A.

(57) ABSTRACT

Positive contrast localization of magnetic (e.g. superparamagnetic) particles in vivo or in vitro by means of SWIFT-MRI using the imaginary component of MR image data in combination with an anatomic reference image derived from the real or magnitude component.

19 Claims, 5 Drawing Sheets

(56) References Cited

U.S. PATENT DOCUMENTS

| | | |
|---|---|---|
| 6,373,250 B1 | 4/2002 | Tsoref et al. |
| 6,963,769 B1 | 11/2005 | Balaban et al. |
| 7,403,006 B2 | 7/2008 | Garwood et al. |
| 2003/0212322 A1 | 11/2003 | Haacke |
| 2005/0019266 A1 | 1/2005 | Unger et al. |
| 2005/0272997 A1 | 12/2005 | Grist et al. |
| 2006/0140871 A1 | 6/2006 | Sillerud |
| 2007/0188171 A1* | 8/2007 | Garwood et al. ............ 324/310 |
| 2007/0188172 A1 | 8/2007 | Garwood et al. |
| 2008/0050376 A1 | 2/2008 | North et al. |
| 2009/0264733 A1 | 10/2009 | Corum et al. |
| 2011/0098554 A1 | 4/2011 | Mardor et al. |

FOREIGN PATENT DOCUMENTS

| | | |
|---|---|---|
| WO | WO-2006051665 A1 | 5/2006 |
| WO | WO-2010114609 A1 | 10/2010 |

OTHER PUBLICATIONS

"U.S. Appl. No. 12/425,113, Final Office Action mailed Mar. 30, 2012", 18 pgs.

"U.S. Appl. No. 12/425113, Response filed Nov. 23, 2011 to Non Final Office Action mailed Jun. 24, 2011", 11 pgs.

"U.S. Appl. No. 12/425,113, Non Final Office Action mailed Jun. 24, 2011", 11 pgs.

"International Application Serial No. PCT/US2010/000979, International Search Report mailed Jul. 2, 2010", 5 pgs.

"International Application Serial No. PCT/US2010/000979, Written Opinion mailed Jul. 2, 2010", 17 pgs.

Corum, C A, et al., "Positive Contrast Fe Nano-particle Imaging of Mouse Brain Vasculature with SWIFT", Proc. Intl. Soc. Mag. Reson. Med., 16, (ISMRM 16th Scientific Meeting & Exhibition (May 3-9, 2008, Toronto, Canada), (2008), p. 1447.

Helluy, X., et al., "Assessing the detection sensitivity of iron loaded cells in spoiled gradient echo imaging", Proc. Intl. Soc. Mag. Reson. Med., 16, (2008), p. 1452.

Idiyatullin, D, et al., "Fast and quiet MRI using a swept radiofrequency", Journal of Magnetic Resonance, 181(2), (Aug. 2006), 342-349.

Idiyatullin, D., et al., "Fast and quiet MRI using a swept radiofrequency", Journal of Magnetic Rresonance, 181(2), (Aug. 2006), 342-349.

Man, L C, et al., "Improved Automatic Off-Resonance Correction Without a Field Map in Spiral Imaging", Magnetic Resonance in Medicine, 37(6), (1997), 906-913.

Moeller, S., et al., "Iterative reconstruction for off-resonance effects in SWIFT imaging", Proc. Intl. Soc. Mag. Reson. Med., 17, (2009), p. 2864.

Reeder, S B, et al., "Off-Resonance Separation for Positive Contrast Imaging of Iron-Oxide Labeled Cells", Proc. Intl. Soc. Mag. Reson. Med., 14, (2006), p. 430.

Zhou, R., et al., "SWIFT Detection of SPIO-Labeled Stem Cells Grafted in the Myocardium", Magnetic Resonance in Medicine, 63, (2009), 1154-1161.

"U.S. Appl. No. 12/425,113, Final Office Action mailed Jun. 17, 2014", 13 pgs.

"U.S. Appl. No. 12/425,113, Non Final Office Action mailed Mar. 4, 2014", 10 pgs.

"U.S. Appl. No. 12/425,113, Response filed Jun. 5, 2014 to Non Final Office Action mailed Mar. 4, 2014", 12 pgs.

"Japanese Application Serial No. 2012-503426, Office Action mailed Apr. 8, 2014", 6 pgs.

Guo, et al., "Efficient Deblurring by Iterative Reconstruction for Spiral-in-out Imaging", Proc. Intl. Soc. Mag. Reson. Med. 14, (May 2006), 2369.

Knopp, et al., "An iterative off-resonance and signal decay correction for improved R2* mapping", Proc. Intl. Soc. Mag. Reson. Med. 15, (May 2007), 1909.

"Japanese Application Serial No. 2012-503426, Office Action mailed Mar. 31, 2015", (w/ English Translation), 15 pgs.

"U.S. Appl. No. 12/425,113, Non Final Office Action mailed Oct. 7, 2015", 16 pgs.

"U.S. Appl. No. 12/425,113, Response filed Jan. 14, 2015 to Final Office Action mailed Jun. 17, 2014", 9 pgs.

"U.S. Appl. No. 12/425,113, Response filed Apr. 7, 2016 to Non Final Office Action mailed Oct. 7, 2015", 15 pgs.

"Japanese Application Serial No. 2012-503426, Examiners Decision of Final Refusal mailed Jan. 26, 2016", (English Translation), 5 pgs.

"Japanese Appiication Serial No. 2012-503426, Office Action mailed Mar. 31, 2015", (w/ English Translation), 15 pgs.

"Japanese Application Serial No. 2012-503426, Response filed Aug. 28, 2015 to Office Action mailed Mar. 31, 2015", 12 pgs.

"Japanese Application Serial No. 2012-503426, Response filed Oct. 1, 2014 to Office Action mailed Apr. 8, 2014", 9 pgs.

"Japanese Application Serial No. 2016-104011, Office Action dated Jun. 13, 2017", (w/ English Translation), 9 pgs.

* cited by examiner

LOCALIZATION OF MAGNETIC PARTICLES BY MEANS OF SWIFT-MRI

CLAIM OF PRIORITY

This patent application is a nationalization under 35 U.S.C. 371, and claims the benefit of priority, of PCT/US 2010/000979, filed Apr. 1, 2010 and published as WO 2010/114609 A1, on Oct. 7, 2010, which claims the benefit of priority, under 35 U.S.C. Section 119(e), to Curtis A. Corum et al., U.S. Provisional Patent Application Ser. 61/166,108, entitled "DETECTION AND QUANTITATION OF MAGNETIC PARTICLES WITH MAGNETIC RESONANCE IMAGING," filed on Apr. 2, 2009, which applications and publication are hereby incorporated herein by reference in their entirety.

STATEMENT REGARDING FEDERALLY SPONSORED RESEARCH OR DEVELOPMENT

This invention was made with government support under award number BTRR P 41 RR008079 from the National Institutes of Health (NIH). The government has certain rights in this invention.

BACKGROUND

Under certain circumstances, images generated using magnetic resonance can exhibit undesirable artifacts related to the subject under examination. For example, tissue including magnetically susceptible elements can yield an image with negative contrast. Present systems are inadequate for imaging tissue including magnetically susceptible elements.

OVERVIEW

The present subject matter enables improved detection and quantitation of a magnetic agent or a magnetic particle using MRI. In one example, a phase flattening algorithm is applied (for B1-) in order to obtain a short dead time complex MRI image, such as from Sweep Imaging with Fourier Transform (SWIFT), SWIFT with Limited TE (SWIFT-LiTE), or ultrashort TE (UTE). In one example, post-processing is used to observe the imaginary (Im) component. The Im component may include information about magnetic particles. In various examples, a region of interest (ROI) can be drawn (or otherwise specified by way of a user-interface) around the region of enhancement by a user or the ROI can be automatically determined. A fitting algorithm can be used to determine the field strength quantifying the mass of iron if the particle type is known. In addition signal enhancement (from $T_1$) can be quantified giving a separate path to quantization.

An example of the present subject matter can be used to detect and quantify constituent elements in a region of interest. For instance, cancer diagnosis, stem cell tracking and liver MRI can be conducted using examples of the present subject matter.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Part 1 includes a description of an example of a magnetic resonance system. Part 2 describes an example of the SWIFT imaging protocol. Part 3 describes an example of detecting an iron-containing agent in the myocardium. Part 4 describes iterative reconstruction for off-resonance effects in SWIFT imaging.

Part 1

Figure 1:
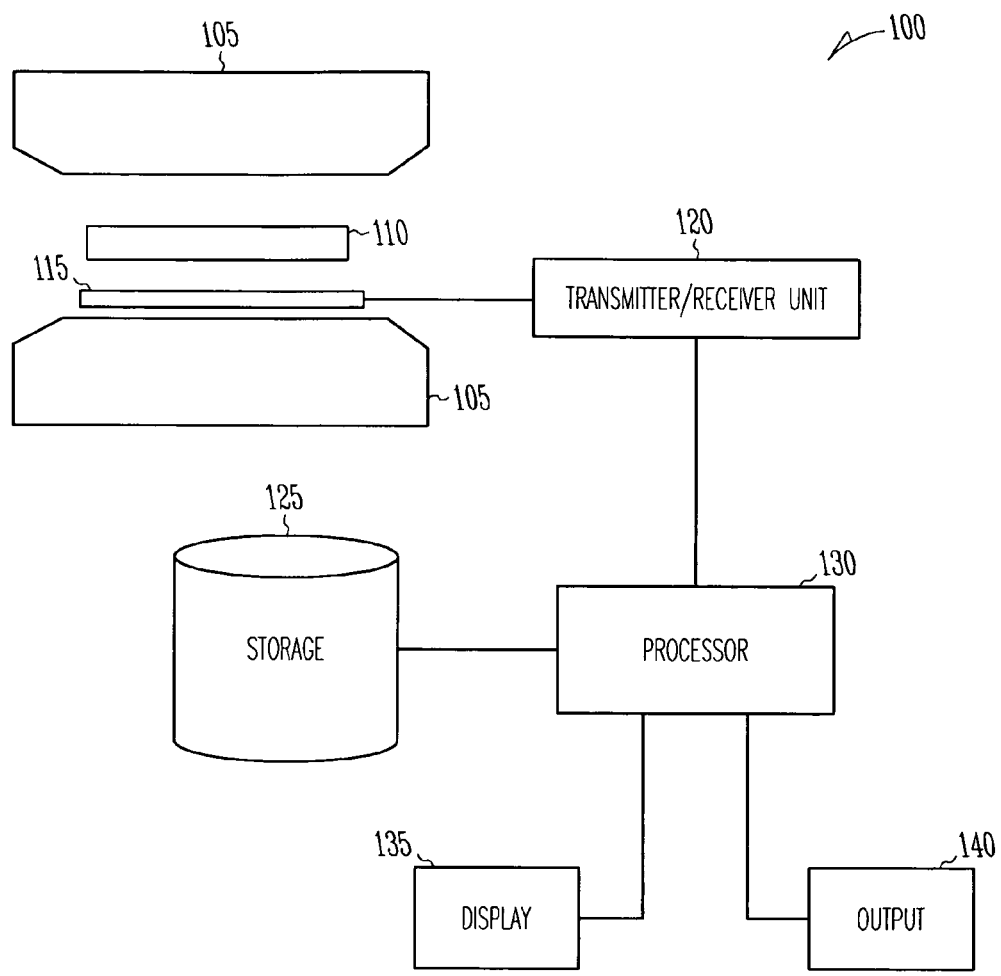
FIG. 1 includes a magnetic resonance system according to one example.

FIG. 1 includes a block diagram of magnetic resonance system 100. Magnetic resonance system 100, in one example, depicts an imaging system 100 having magnet 105. In one example, system 100 includes an electron paramagnetic resonance system. Magnet 105 can provide a biasing magnetic field. Coil 115 and subject 110 are positioned within the field of magnet 105. Subject 110 can include a human body, an animal, a phantom, or other specimen. Coil 115, sometimes referred to as an antenna, can include a transmit coil, a receive coil, a separate transmit coil and receive coil, or a transceiver coil. Coil 115 is in communication with transmitter/receiver unit 120 and with processor 130. In various examples, coil 115 both transmits and receives radio frequency (RF) signals relative to subject 110. Transmitter/receiver unit 120 can include a transmit/receive switch, an analog-to-digital converter (ADC), a digital-to-analog converter (DAC), an amplifier, a filter, or other modules configured to excite coil 115 and to receive a signal from coil 115. Transmitter/receiver unit 120 is coupled to processor 330.

Processor 130 can include a digital signal processor, a microprocessor, a controller, or other module. Processor 130, in one example, is configured to generate an excitation signal (for example, a pulse sequence) for coil 115. Processor 130, in one example, is configured to perform a post-processing operation on the signal received from coil 115. Processor 130 is also coupled to storage 125, display 135 and output unit 140.

Storage 125 can include a memory for storing data. The data can include image data as well as results of processing performed by processor 130. In one example, storage 125 provides storage for executable instructions for use by processor 130. The instructions can be configured to generate and deliver a particular pulse sequence or to implement a particular algorithm.

Display 135 can include a screen, a monitor, or other device to render a visible image corresponding to subject 110. For example, display 135 can be configured to display a radial projection, a Cartesian coordinate projection, or other view corresponding to subject 110. Output unit 140 can include a printer, a storage device, a network interface or other device configured to receive processed data.

The present subject matter can be implemented using system 100 or other system suitable for nuclear magnetic resonance, magnetic resonance imaging, electron spin resonance (ESR), electron paramagnetic resonance (EPR), ferromagnetic resonance (FMR), or ferromagnetic spin wave resonance (FSWR).

Part 2

In nuclear magnetic resonance (NMR, also abbreviated as magnetic resonance, MR), RF excitation can be described as sequential, simultaneous, and random. Three different corresponding NMR techniques are used, including continuous wave (CW), pulsed, and stochastic.

Pulsed FT spectroscopy can be used with high resolution NMR. MRI has additional technical requirements over high resolution NMR. Because the objects of interest are much larger than a test tube, inevitably the static and RF fields used in MRI are more inhomogeneous than those used in high resolution NMR.

As in CW, the SWIFT method uses RF sweep excitation and uses a sweep rate that exceeds the sweep rate of the CW method by more than a few orders of magnitude. Unlike the CW method in which the signal is acquired in the frequency domain, in SWIFT, the signal is considered as a time function, as in the pulsed FT method. In addition, SWIFT uses the correlation method similar to stochastic NMR in order to extract proper spectral information from the spin system response.

The rapid-scan FT technique and SWIFT technique have some common properties but are different in point of view to system response on excitation. Rapid-scan FT considers the system response in frequency domain and SWIFT considers the system response in the time domain. As a result, the spectra obtained using SWIFT is insensitive to the linearity of the sweep rate. This permits use of a broad class of frequency modulated pulses having more uniform excitation profiles than the chirp excitation required in rapid-scan FT. SWIFT also provides virtually simultaneous excitation and acquisition of signal. Accordingly, SWIFT has a "zero echo time", and so is well-suited for studying objects having very fast spin-spin relaxation (or very short $T_2$). SWIFT can be used for MRI of quadrupolar nuclei, such as sodium-23, potassium-39, and boron-11.

SWIFT Methodology

Figure 2A:
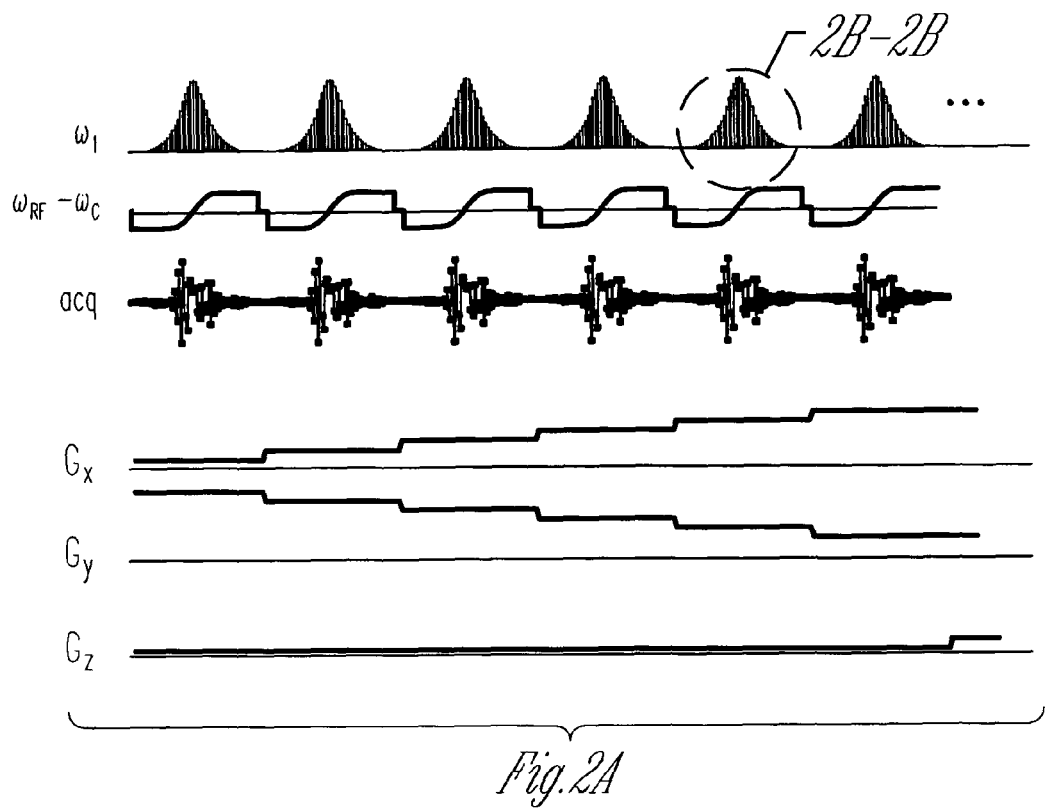
FIGS. 2A, 2B, and 2C include diagrams for a pulse sequence for SWIFT according to one example.
Figure 2B:
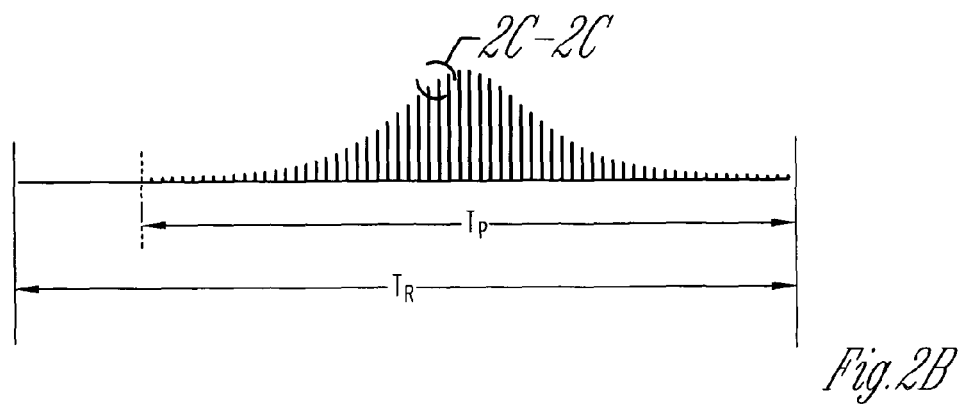
Figure 2C:
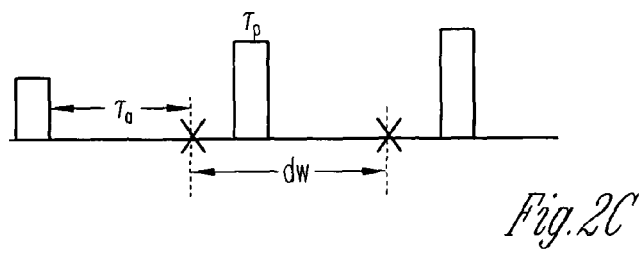

SWIFT can be modeled by the method presented in FIG. 2A. SWIFT employs a sequence of frequency-modulated pulses with short repetition time TR that exceeds the pulse length $T_p$ by at least the amount of time needed for setting a new value (or orientation) of a magnetic field gradient used to encode spatial information. The images are processed using 3D back-projection reconstruction. In one example, frequency-modulated pulses from the hyperbolic secant family (HSn pulses) are used. In FIG. 2B, one shaped pulse is represented which includes N different sub-pulse elements with time-dependent amplitudes and phases. During the FM pulse, an isochromat follows the effective RF field vector until the instant resonance is attained. At resonance, the isochromat is released from the RF pulse's "hug" and thereafter almost freely precesses with a small decaying modulation, yielding spectral contamination. Thus, to extract spectral information from such a spin system response, processing is performed using a cross-correlation method similar to the method of recovering phase information in stochastic NMR. The theoretically achievable signal-to-noise ratio (SNR) per unit time for SWIFT for TR<<$T_1$ is the same as that for pulsed FT. During SWIFT acquisition, the applied imaging gradients usually exceed all intrinsic gradients due to susceptibility or inhomogeneity. For this condition the images obtained are fully independent of transverse relaxation and signal intensity depends only on $T_1$ and spin density. The maximum $T_1$ contrast depends on effective flip angle and the best compromise between sensitivity and contrast will have flip angles exceeding two times the Ernst angle. If flip angles are very small, $T_1$ contrast is negligible, and contrast comes entirely from spin density. Other kinds of contrast can be reached by an appropriate preparation sequence prior to or interleaved with the image acquisition.

SWIFT provides novel and beneficial properties for MRI, including the following:

(a) fast: SWIFT eliminates the delays associated with refocusing pulses or gradient inversion, and also time for an excitation pulse, which is integrated with the acquisition period. As in other fast imaging sequences, SWIFT is limited by existing imaging system hardware and chosen compromise between acquisition speed, spatial resolution and SNR.

(b) sensitive to short $T_2$: SWIFT is sensitive to excited spins having $T_2$>1/SW (SW=spectral width). To be specifically resolved, $T_2$>N/SW must be satisfied, which is theoretically feasible even for solid objects by increasing SW.

(c) reduced motion artifacts: Because SWIFT has no "echo time" it is less sensitive to motion artifacts. It loses less signal due to either diffusion in the presence of a gradient or uncompensated motion than other fast sequences.

(d) reduced dynamic range requirement: Because the different frequencies are excited sequentially the resulting signal is distributed in time with decreased amplitude of the acquired signal. This allows more effective utilization of the dynamic range of the digitizer.

(e) quiet: SWIFT uses a small step when changing gradients between projections, and thus, fast gradient switching that creates loud noise can be avoided. SWIFT can also be operated in rapid updated mode to reach high temporal resolution in dynamic studies. This pseudo-temporal resolution is possible because projection reconstruction, unlike Fourier imaging, samples the center of k-space with every acquisition.

Part 3

SWIFT can be used to detect superparamagnetic iron-oxide (SPIO) labeled stem cells grafted in the myocardium.

In addition to elements labeled using SPIO, other magnetic or paramagnetic materials can also be used as a label or contrast agent. For example, ultrasmall superparamagentic iron oxide particles USPIO, or monocrystalline iron oxide nanoparticles (MION) can also be used. The term magnetic includes the term paramagnetic. A magnetic material can be ferromagnetic (a material that produces its own persistent magnetic field), paramagnetic (a material that is attracted to a magnetic field), or diamagnetic (a material that is repulsed by a magnetic field).

For example, superparamagnetic iron-oxide labeling of stem cells allows their detection by MRI with high sensitivity via their $T_2^*$ effect. Consequently, $T_2/T_2^*$ weighted gradient focused echo (GRE) detection leads to negative contrast (signal dropout) with low SNR and poor specificity because a similar signal void would occur at tissue boundaries or in hemorrhagic region.

A method can be used to convert a negative contrast to positive contrast and such methods can be applied to track SPIO labels in cardiovascular system. Since the on-resonance water signal is suppressed (or not excited), a separate anatomical image is usually necessary to register with the image containing SPIO signals. Such requirement might pose a limitation in a particular cardiovascular system, where tissue motion is likely to induce errors for co-registration.

Sweep imaging with Fourier transformation (SWIFT) technique can be used to image spins having extremely fast transverse relaxation rate.

In addition, SWIFT can be used to visualize SPIO labeled cells.

The present subject matter concerns SWIFT technique that can visualize the susceptibility artifacts leading to enhanced detection of magnetic particles. SNR.

Example Methods

Murine embryonic stem cells can be labeled with magnetic particles and such labeled cells can be grafted directly into the myocardium of a rat. In vivo detection can be achieved using a fast GRE sequence with cardiac and respiratory gating.

Short and long axis cine images of the heart can be acquired at 4.7 T. Two-dimensional GRE and 3D SWIFT imaging of the heart can be performed using a 4.7 T and 9.4 T magnet system respectively. The figures illustrate in-plane resolution of $100^2$ μm$^2$ with 500 μm slice thickness using GRE and an isotropic resolution of $98^3$ μm$^3$ using SWIFT. For the SWIFT acquisition, bandwidth is 125 kHz, flip angle is 20°, TR is 2 ms and TE is 6 μs, and the 3D data can be acquired in 15 min with 4 averages.

Example Results

Figure 3A:
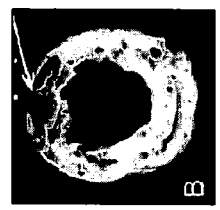
FIGS. 3A, 3B include images of a heart.
Figure 3B:
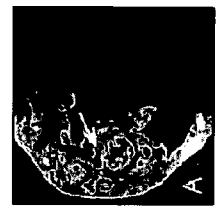

FIG. 3A illustrates in vivo GRE detection of SPIO labeled stem cells (arrows) and FIG. 3B illustrates ex vivo GRE detection of SPIO labeled stem cells (arrows). The GRE images depict a short axis view of the same heart.

Figure 4A:
FIGS. 4A and 4B includes images for a slice based on FIG. 3B.
Figure 4B:

FIG. 4A includes the magnitude image and FIG. 4B includes the imaginary SWIFT image corresponding approximately to the slice shown in FIG. 3B (note that slice thickness of ex vivo GRE is 5-fold of SWIFT). While the GRE image of FIG. 3B shows the typical "blooming effect" associated with susceptibility, such artifacts are suppressed by SWIFT: the hypointense region in the magnitude images is well defined with enhanced boundaries (FIG. 4A), which are shown on the phase images (FIG. 4B). Imperfections in refocusing the signal in certain boundary region (arrows) can be corrected by post-processing the data. The magnitude images provide $T_1W$ signals of the myocardial wall. Therefore, it is not necessary to acquire any reference image for co-registration.

The data from the magnetic resonance system can include complex data having a first component and a second component. For example, the complex data can include a magnitude component and a phase component or the complex data can include a real component and an imaginary component.

SWIFT can positive contrast imaging and is suitable for cardiovascular applications.

Part 4

The following part describes iterative reconstruction for off-resonance effects in SWIFT imaging.

Strong local field inhomogeneities can be challenging for MRI. The challenges are three-fold: (a) excite the larger bandwidth, (b) acquire the signal from regions with short $T_2^*$, and (c) determine the correct and undistorted spatial frequency of the signal. The excitation and acquisition of fast relaxing signals are well captured by the SWIFT sequence.

Even with high bandwidth, as used for SWIFT, the acquired signal can still be spatially distorted. Traditional methods, such a two acquisitions with different TE's, for estimating field maps, are not always possible options. This is a concern for applications involving long acquisitions that can not be repeated, in-vivo imaging of moving organs (heart, lungs etc.), or when imaging short $T_2$ signals, where the signal is dephased even at the shortest possible TE. For correction of field inhomogeneities when mapping is not possible, auto-focusing methods can be used for smoothly varying field inhomogenieties.

For 3D radial imaging the feasibility of quickly reconstructing the acquired signal to a different off-resonance frequency by applying radial phase shifts in the gridded k-space makes it tractable to use iterative methods.

To demonstrate that signal recovery is feasible using SWIFT signals, an example of the present subject matter can implement an iterative frequency shift method for correction of the unknown local magnetic fields which are not necessarily slowly varying.

Methods

As described elsewhere in this document, murine embryonic stem cells can be labeled.

After reconstruction (through gridding) to a Cartesian grid of the standard SWIFT signal, a 3D region of interest (ROI) covering the insertion area of the SPIO's can be selected for auto-focusing. In an example described herein, the volume of interest (VOI) selected encompassed 100×60×50 voxels. A series of images with different off-resonance shift can be used as a basis for estimating the correct reallocation of signal. A minimization function for minimizing the square root of the magnitude of the imaginary part of the signal can be used. For sequential refinement, decreasingly smaller VOI's of $13^3$, $9^3$, $7^3$, $5^3$, $3^3$ voxels can be used for averaging to prevent noise amplification.

Results

Figure 5A:
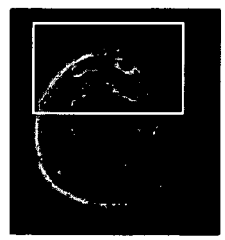
FIGS. 5A, 5B, and 5C illustrate views of a heart.

Imaging with SWIFT confirms a locally and moderately strong $T_2^*$. In FIG. 5A, the location of the ROI in a slice is identified by the rectangular box. FIG. 5A includes a cropped FOV of representative short axis images of in-vitro rat heart using SWIFT for 6 sequential slices, with some ballooning due to $T_2^*$. The box indicates the size of the VOI used for off-resonance correction.

Figure 5B:
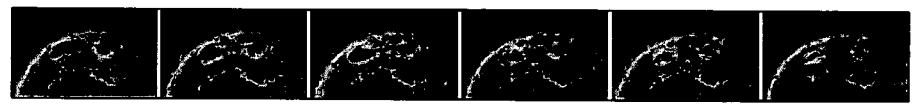
Figure 5C:
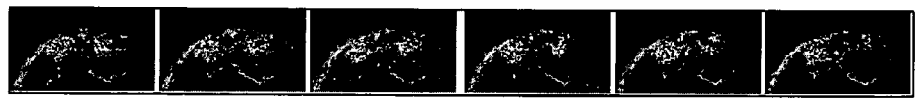

The row of images in FIG. 5B illustrates hyperintense signal due to $T_2^*$ at the border of the SPIO injection site for sequential slices. After correction, more homogenous signal distribution of the voids observed in the SWIFT acquisition is achieved as shown in the row of images at FIG. 5C. FIG. 5C includes reconstruction of signal after iterative off-resonance correction.

The residual bright signal is not inconsistent with bright contrast from SPIO's when imaged with SWIFT.

Additional Notes

Figure 6:
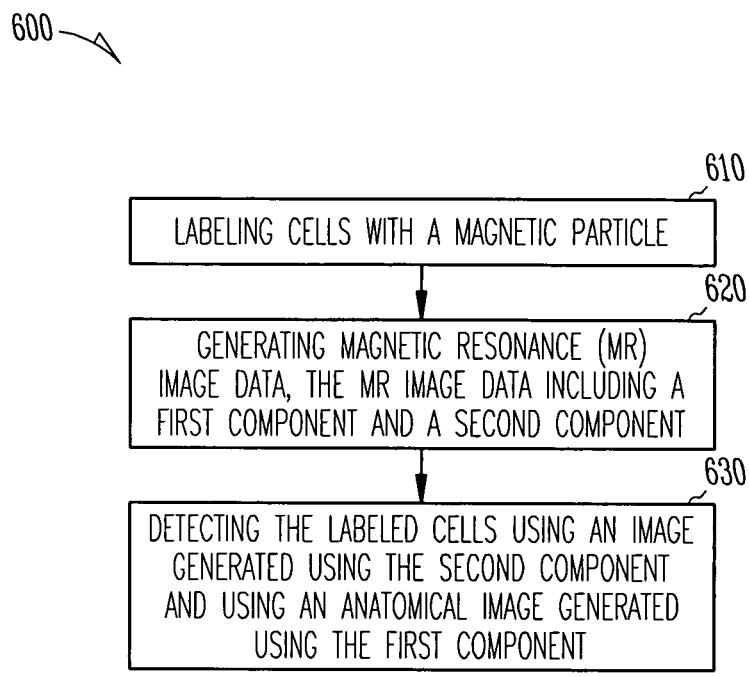
FIG. 6 includes a method according to one example.

FIG. 6 illustrates method 600 according to one example. Method 600 includes; at 610, labeling cells of a specimen with a magnetic particle. The magnetic particle can include a paramagnetic tag. At 620, the method includes generating magnetic resonance (MR) image data for the specimen using swept frequency excitation and substantially simultaneous signal acquisition in a time-shared mode, the MR image data including a first component and a second component. At 630, the method includes detecting the labeled cells using an image generated using the second component and using an anatomical image generated using the first component.

In one example, detecting the labeled cells using the image generated using the second component includes using at least one of a phase component or an imaginary component. One example further includes generating the anatomical image using at least one of a magnitude component or a real component of the MR image data.

One example further includes using a local frequency shift to correct for an off-resonance artifact during signal acquisition. Generating MR image data can include performing at least one of SWIFT, SWIFT-LiTE, or UTE. According to one example, detecting the labeled cells includes identifying a position of the labeled cells.

The sweep imaging with Fourier transformation (SWIFT) method can be used to visualize SPIO labeled cells grafted to tissue. SWIFT uses a frequency-swept excitation and virtually simultaneous signal acquisition in a time-shared mode. SWIFT is suited for imaging objects with fast spin-spin relaxation rates and produces data with reduced "ballooning" susceptibility artifacts. The real and imaginary parts of the SWIFT image can be used in identifying the SPIO-labeled cells.

The magnitude and imaginary images generated from 3D-SWIFT for heart tissue is shown in the figures along with GRE counterparts. The GRE images show "blooming effect" associated with magnetic field inhomogeneity induced by the presence of SPIO. The magnetic susceptibility artifacts are suppressed using SWIFT. The SWIFT imaginary images present a positive contrast for spins dephased by the presence of SPIO labels and the majority of the moderate $T_2$* effects are not visible, thus simplifying detection of SPIO labeled cells.

Imperfections in refocusing signal in certain boundary region and a method utilizing iterative frequency shift can be implemented to further correct the image. The SWIFT magnitude images present anatomical details and an enhanced boundary surrounding the SPIO-associated hypointense region. The magnitude image can serve as the reference image on which the SPIO-associated signal is fused without the need to co-register the two.

A method according to one example can detect magnetic content in tissue including intrinsic iron. The intrinsic iron content can include ferretin, hemoglobin, or a cytochrome.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
   a magnetic resonance scanner; and
   a processor coupled to the scanner and configured to generate magnetic resonance (MR) image data, the MR image data including complex data having a first component and a second component for a subject, the processor configured to generate a first image using the first component and generate a second image using the second component, the MR image data acquired in a time-share mode and substantially simultaneous with excitation, the excitation including a short $T_2$ sensitive sequence provided by the scanner, and wherein the first image corresponds to anatomy of the subject and the second image corresponds to a magnetic material within the subject, the first image different from the second image, and the processor configured to identify a position of the magnetic material within the subject based on the second image.

2. The system of claim 1 wherein the processor is configured to iteratively correct for an off-resonance frequency artifact.

3. The system of claim 1 wherein the processor is configured to register the first component and the second component.

4. The system of claim 3 wherein the first component includes at least one of a magnitude component or a real component.

5. A method comprising:
labeling cells of a specimen with a magnetic particle;
generating magnetic resonance (MR) image data for the specimen using swept frequency excitation and substantially simultaneous signal acquisition in a time-shared mode, the MR image data including a first component and a second component;
generating a first image using the first component and generating a second image using the second component, the first image corresponding to an anatomical image of the specimen, the first image different from the second image; and
detecting the labeled cells using the second image and using the first image.

6. The method of claim 5 wherein detecting the labeled cells using the second image includes using at least one of a phase component or an imaginary component.

7. The method of claim 6 wherein generating the first image includes using at least one of a magnitude component or a real component of the MR image data.

8. The method of claim 5 further including using a local frequency shift to correct for an off-resonance artifact during signal acquisition.

9. The method of claim 5 wherein generating MR image data includes performing at least one of SWIFT, SWIFT-LiTE, or UTE.

10. The method of claim 5 wherein detecting the labeled cells includes identifying a position of the labeled cells.

11. A method comprising:
labeling a tissue of a specimen of interest with a magnetic contrast agent;
generating magnetic resonance (MR) image data for the specimen of interest utilizing a short $T_2$ sensitive MR imaging sequence, the sequence including swept frequency excitation and the image date acquired substantially simultaneous with excitation, the data including a first component and a complementary component, wherein the first component corresponds to an anatomical image of the specimen;
using the data to form a second image corresponding to the complementary component and corresponding to the magnetic contrast agent; and
detecting the labeled tissue using the second image.

12. The method of claim 11 wherein the tissue includes an exogenously labeled cell.

13. The method of claim 11 wherein the contrast agent includes at least one of a molecule or a particle.

14. The method of claim 11 wherein labeling the tissue includes injecting the tissue with a paramagnetic material.

15. The method of claim 14 wherein the paramagnetic material includes a superparamagnetic material.

16. The method of claim 11 wherein the tissue includes intrinsic iron content.

17. The method of claim 16 wherein the intrinsic iron content includes at least one of ferretin, hemoglobin, or a cytochrome.

18. The method of claim 11 wherein detecting the labeled tissue includes identifying a position of labeled cells.

19. The method of claim 11 wherein the complementary component includes at least one of a phase component or an imaginary component.

* * * * *

UNITED STATES PATENT AND TRADEMARK OFFICE
CERTIFICATE OF CORRECTION

PATENT NO. : 9,841,480 B2
APPLICATION NO. : 13/262397
DATED : December 12, 2017
INVENTOR(S) : Curtis A. Corum et al.

It is certified that error appears in the above-identified patent and that said Letters Patent is hereby corrected as shown below:

In the Specification

Column 1, Lines 20-23:
"This invention was made with government support under award number BTRR P 41 RR008079 from the National Institutes of Health (NIH). The government has certain rights in this invention."
Should be:
--This invention was made with government support under RR008079 awarded by the National Institutes of Health. The government has certain rights in the invention.--

Signed and Sealed this
Eleventh Day of June, 2024

Katherine Kelly Vidal
*Director of the United States Patent and Trademark Office*